US008502257B2

(12) United States Patent　　　(10) Patent No.: US 8,502,257 B2
Chang et al.　　　　　　　　　　　(45) Date of Patent: Aug. 6, 2013

(54) LIGHT-EMITTING DIODE PACKAGE

(75) Inventors: Kuo-Ching Chang, Hsinchu (TW);
Wu-Cheng Kuo, Hsinchu (TW);
Tzu-Han Lin, Hsinchu County (TW)

(73) Assignee: VisEra Technologies Company Limited, Hsinchu (TW)

( * ) Notice: Subject to any disclaimer, the term of this patent is extended or adjusted under 35 U.S.C. 154(b) by 344 days.

(21) Appl. No.: 12/613,003

(22) Filed: Nov. 5, 2009

(65) Prior Publication Data
US 2011/0101405 A1　　May 5, 2011

(51) Int. Cl.
*H01L 27/15*　　(2006.01)
*H01L 29/267*　　(2006.01)
*H01L 31/12*　　(2006.01)
*H01L 33/00*　　(2010.01)
*H01L 31/0203*　　(2006.01)

(52) U.S. Cl.
USPC ...... 257/99; 81/433; 81/E33.001; 81/E33.055

(58) Field of Classification Search
USPC ............... 257/81, 99, 444, E33.001, E33.055
See application file for complete search history.

(56) References Cited

U.S. PATENT DOCUMENTS

| 4,881,237 | A * | 11/1989 | Donnelly | 372/50.12 |
|---|---|---|---|---|
| 6,060,729 | A * | 5/2000 | Suzuki et al. | 257/99 |
| 7,372,082 | B2 * | 5/2008 | Kim et al. | 257/99 |
| 7,420,223 | B2 * | 9/2008 | Ishidu et al. | 257/99 |
| 2002/0163006 | A1 * | 11/2002 | Yoganandan et al. | 257/81 |
| 2005/0280017 | A1 * | 12/2005 | Oshio et al. | 257/99 |
| 2005/0280019 | A1 * | 12/2005 | Konno | 257/100 |
| 2006/0060877 | A1 * | 3/2006 | Edmond et al. | 257/99 |
| 2006/0163596 | A1 * | 7/2006 | Kim et al. | 257/98 |
| 2007/0194336 | A1 * | 8/2007 | Shin et al. | 257/98 |
| 2008/0067537 | A1 * | 3/2008 | Kolodin et al. | 257/99 |
| 2008/0149962 | A1 * | 6/2008 | Kim et al. | 257/99 |
| 2008/0169537 | A1 * | 7/2008 | Kajiwara et al. | 257/666 |
| 2009/0078956 | A1 * | 3/2009 | Tseng et al. | 257/98 |
| 2009/0134421 | A1 * | 5/2009 | Negley | 257/98 |
| 2009/0206358 | A1 * | 8/2009 | Chen et al. | 257/99 |

FOREIGN PATENT DOCUMENTS

| CN | 85109419 A | 6/1986 |
|---|---|---|
| EP | 2 093 811 | 8/2009 |
| JP | 2007-012643 A | 1/2007 |
| TW | 200802921 | 1/2008 |
| TW | 200929470 | 7/2009 |
| TW | 200945961 | 11/2009 |
| WO | WO 2006/046981 | 5/2006 |

OTHER PUBLICATIONS

Office Action mailed Feb. 3, 2012 in corresponding Chinese Application 201010143364.7, pp. 1-5, with English translation.

* cited by examiner

*Primary Examiner* — Teresa M Arroyo
(74) *Attorney, Agent, or Firm* — Muncy, Geissler, Olds & Lowe, PLLC

(57) ABSTRACT

A light-emitting diode package is provided. The light-emitting diode package comprises a substrate and a first metal layer disposed over the substrate. A solder layer is disposed on the first metal layer and a light-emitting diode chip is disposed on the solder layer, wherein the light-emitting diode chip comprises a conductive substrate and a multilayered epitaxial structure formed on the conductive substrate, and wherein the conductive substrate is adjacent to the solder layer.

17 Claims, 5 Drawing Sheets

LIGHT-EMITTING DIODE PACKAGE

BACKGROUND OF THE INVENTION

1. Field of the Invention

The invention relates to a light-emitting diode (LED) package and more particularly to an LED package with improved bonding strength between a substrate and an LED chip thereof.

2. Description of the Related Art

Light-emitting diodes (LEDs) are playing an increasingly important role in the daily lives of humans. They are capable of reliably providing illumination with high brightness and thus are applied in display devices, traffic lights, indicator units and other electronic devices. LEDs are fabricated by depositing an n-doped semiconductor layer, an active layer and a p-doped semiconductor layer on a substrate. Some LEDs have an n-contact formed on one side of a device and a p-contact formed on the opposite side of the device. Other LEDs have both contacts formed on the same side of a device.

In conventional packaging methods, LED chips are packaged by a lead frame packaging technology. The LED chip is mounted on a surface of a lead frame by silver glue. The lead frame is made of plastic and has lead pads located on the bottom surface thereof. Then, the lead frame is bonded on a printed circuit board (PCB) through solder balls between the lead pads and the PCB. However, the bonding strength provided by the silver glue is often insufficient, wherein the LED chip detaches from the lead frame, thereby decreasing reliability of the LED package. Additionally, the silver glue does not dissipate heat generated during operation of the LED device. Thus, efficiency of the LED device is hindered thereby.

In other conventional packaging methods, the LED chip is mounted on a surface of a lead frame by a eutectic bonding method, for example by using a solder made of Sn—Au. In this LED package, epitaxial layers of the LED chip are formed on a silicon substrate. Although the Sn—Au solder has higher bonding strength than that of the silver glue, costs thereof are higher.

Therefore, an LED package capable of overcoming the above problems is desired.

BRIEF SUMMARY OF THE INVENTION

A light-emitting diode (LED) package is provided, whereby reliability of the LED package is enhanced through higher bonding strength between a substrate and an LED chip thereof, and efficiency of the LED device is enhanced through improved heat dissipation of the LED packages.

An exemplary embodiment of the LED package comprises a substrate and a first metal layer disposed over the substrate. A solder layer is disposed on the first metal layer. Then, a light-emitting diode chip is disposed on the solder layer, wherein the light-emitting diode chip comprises a conductive substrate and a multilayered epitaxial structure disposed on the conductive substrate, and wherein the conductive substrate is disposed adjacent to the solder layer. In the LED package, the conductive substrate of the light-emitting diode chip and the first metal layer of the substrate are soldered to the solder layer by a reflow process.

In an exemplary embodiment, the solder layer may be made of Sn—Cu alloy, the conductive substrate of the light-emitting diode chip can be made of Cu, and the first metal layer of the substrate can be made of Ag or Au. According to an exemplary embodiment of the invention, the bonding strength between the LED chip and the substrate is enhanced when compared to conventional methods.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
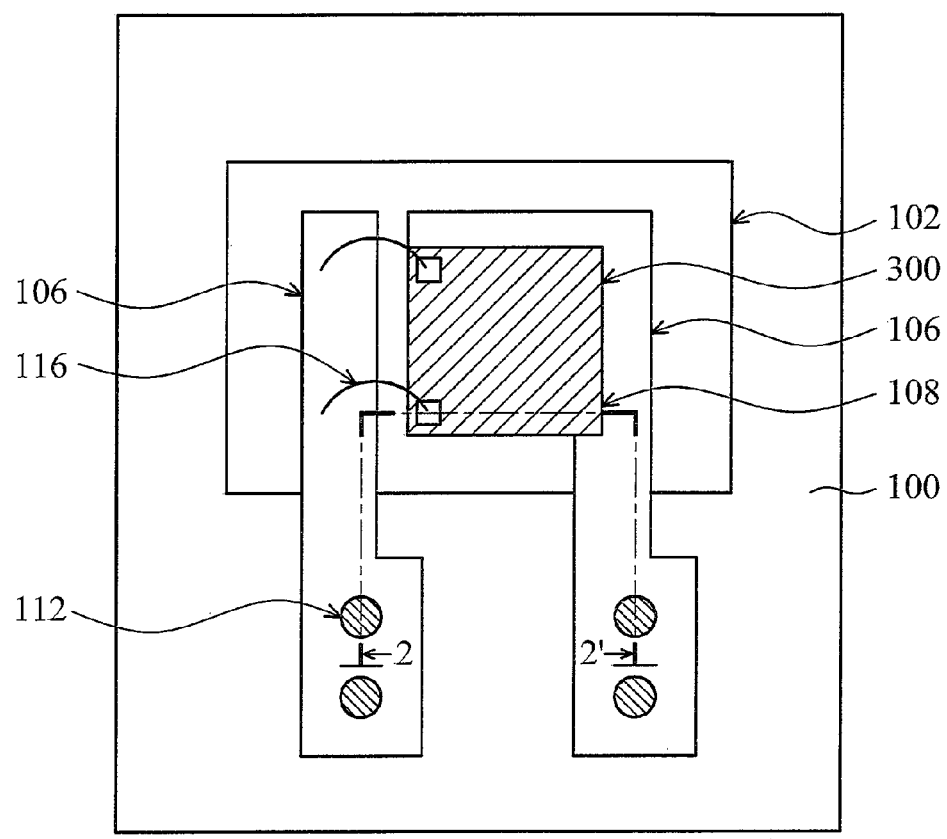
FIG. 1 is a schematic plane view of an LED package according to an embodiment of the invention.

The invention provides LED packages with high bonding strength between a substrate and an LED chip thereof, with high heat dissipating efficiency. FIG. 1 shows a plane view of an LED package according to an embodiment of the invention. As shown in FIG. 1, a light-emitting diode chip 300 is disposed in a cavity 102 of a substrate 100. In an embodiment of the invention, the light-emitting diode chip 300 may be a vertical typed LED chip, having a lower contact (not shown) such as a p-type contact on a bottom surface of the LED chip 300 and an upper contact 210 such as an n-type contact on a top surface of the LED chip 300. In another embodiment, the lower contact of the LED chip 300 can be an n-type contact and the upper contact 210 of the LED chip 300 can be a p-type contact. In another embodiment of the invention, the light-emitting diode chip may be a horizontal typed LED chip, having two contacts of a p-type contact and an n-type contact on a top surface of the LED chip (not shown). The LED chip 300 includes a multi-layer epitaxial structure formed on a conductive substrate.

A patterned multi-layered metal structure 106 is formed over the substrate 100 and extends into the cavity 102 to form conductive pads. A patterned first metal layer 108 is formed on the patterned multi-layered metal structure 106. The LED chip 300 is then disposed over the patterned first metal layer 108. From a top view, the patterned first metal layer 108 has a size substantially the same as a size of the LED chip 300. A solder layer (not shown) is disposed between the LED chip 300 and the patterned first metal layer 108. In an embodiment for the vertical typed LED chip, the lower contact and the upper contact of the LED chip 300 are electrically connected to the patterned multi-layered metal structure 106, respectively. The lower contact of the LED chip 300 is electrically connected to the patterned multi-layered metal structure 106 through the conductive substrate of the LED chip 300, the solder layer and the patterned first metal layer 108. The upper contact 210 of the LED chip 300 is electrically connected to the patterned multi-layered metal structure 106 through a conductive wire 116. In addition, a plurality of through vias 112 is formed passing through the patterned multi-layered metal structure 106 and the substrate 100. The through vias 112 are electrically connected to the upper contact 210 and the lower contact of the LED chip 300 respectively through the patterned multi-layered metal structure 106. The LED chip 300 is electrically connected to an external circuit through the through vias 112.

In another embodiment for the horizontal typed LED chip (not shown), these two contacts on the top surface of the LED chip are electrically connected to the patterned multi-layered metal structure, respectively, through two conductive wires. Moreover, the through vias formed passing through the multi-layered metal structure and the substrate are electrically connected to the two contacts of the horizontal typed LED chip, respectively, through the patterned multi-layered metal structure and the conductive wires. Then, the horizontal typed LED chip is electrically connected to an external circuit through the through vias.

Figure 2A:
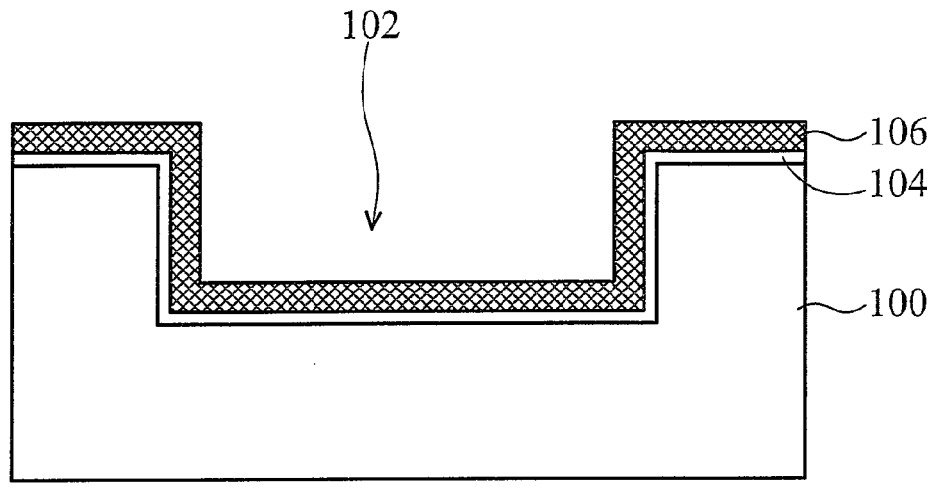
FIGS. 2A-2H show cross sections of forming an LED package according to an embodiment of the invention.

FIGS. 2A-2H show cross sections of forming an LED package along the dotted line 2-2' of FIG. 1 according to an embodiment of the invention. Referring to FIG. 2A, the substrate 100 is provided, such as a semiconductor substrate, a ceramic substrate or a printed circuit board. In an embodiment, the substrate 100 may be a silicon substrate. Then, the cavity 102 is formed in the substrate 100 by a photolithography and etching process. In an embodiment, the cavity 102 may have a depth of 30 μm to 150 μm. Next, an insulating layer 104 is conformally formed on the substrate 100 and in the cavity 102 by a chemical vapor deposition (CVD) method, a thermal oxidation process or other deposition methods. The insulating layer 104 may be silicon oxide, silicon nitride or other suitable insulating materials.

Then, a multi-layered metal structure 106 is formed on the insulating layer 104. In an embodiment, the multi-layered metal structure 106 may be formed from three metal layers, such as TiW, Cu and Ni layers formed in sequence by a sputtering process, a physical vapor deposition (PVD) method or other deposition methods. As shown in FIG. 2A, the insulating layer 104 and the multi-layered metal structure 106 are conformally formed on the surface of the substrate 100 and on the sidewalls and the bottom surface of the cavity 102.

Figure 2B:
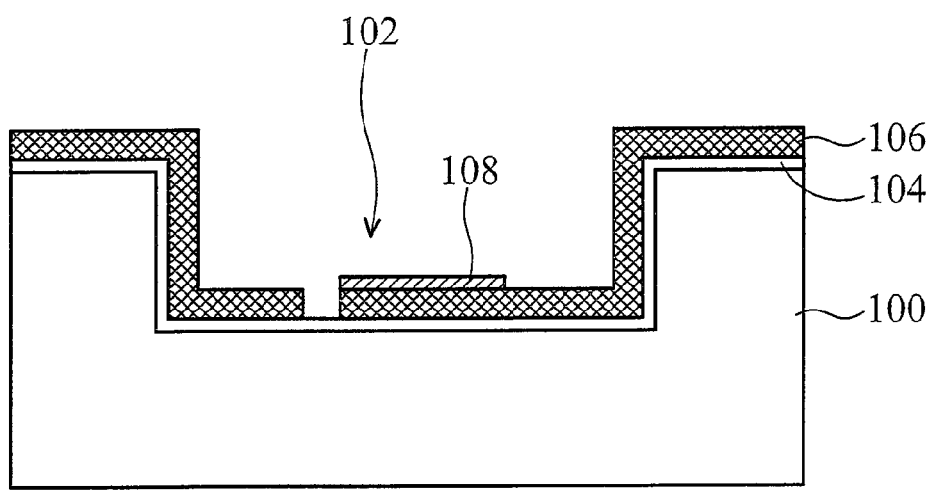

Next, referring to FIG. 2B, the multi-layered metal structure 106 is patterned by a photolithography and etching process to form a patterned multi-layered metal structure 106. The patterned multi-layered metal structure 106 can be used as conductive pads on the substrate 100. Then, a patterned first metal layer 108 is formed on the patterned multi-layered metal structure 106. In an embodiment, the patterned first metal layer 108 may be formed by coating a metal layer on the patterned multi-layered metal structure 106 and then patterning the metal layer by a photolithography and etching process to form the patterned first metal layer 108. In another embodiment, the patterned first metal layer 108 may be formed by a printing process. The material of the patterned first metal layer 108 may comprise Cu, Ni, Au or Ag, wherein Au or Ag is preferred. It is noted that the patterned first metal layer 108 has a size substantially the same as a size of a LED chip hereafter formed on the patterned first metal layer 108. Meanwhile, the position of the patterned first metal layer 108 is the same as that of the LED chip.

Figure 2C:
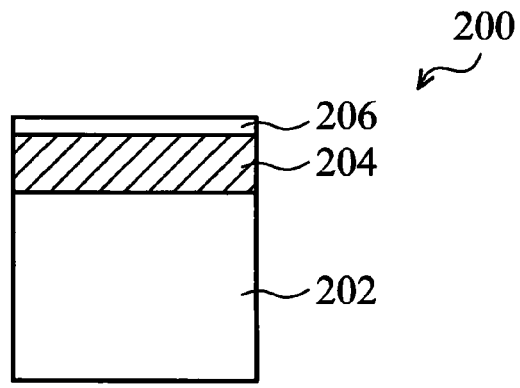

Referring to FIG. 2C, a light-emitting diode (LED) chip 200 is provided. In an embodiment, the LED chip 200 may be a blue LED chip including a multi-layer epitaxial structure 204 formed on a sapphire substrate 202. A contact 206 is formed on the multi-layer epitaxial structure 204. The contact 206 may be made of indium tin oxide (ITO), Ag, Al, Cr, Ni, Au, Pt, Pd, Ti, Ta, TiN, TaN, Mo, W or other conductive materials. The multi-layer epitaxial structure 204 may consist of a buffer layer, an n-GaN layer, a multi-quantum well (MQW) active layer, and a p-GaN layer formed in sequence on the sapphire substrate 202. The buffer layer may be an AlN, GaN, AlGaN or AlnGaN layer. The MQW active layer may be an InGaN/GaN or an Al GaN/GaN MQW active layer. The contact 206 may be a p-type contact or an n-type contact. In an embodiment of the invention, the sapphire substrate 202 is used as a carrier substrate.

Figure 2D:
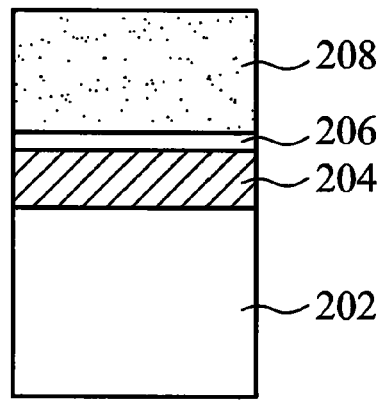

Then, referring to FIG. 2D, a conductive substrate 208 is formed over the multi-layer epitaxial structure 204. In an embodiment, the conductive substrate 208 may be made of Cu and formed by an electroplating process, an electroless plating process or a bonding process.

Figure 2E:
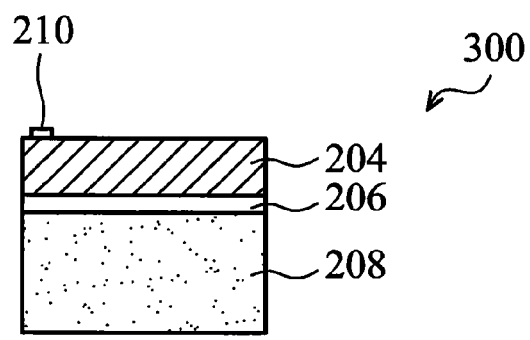

Next, referring to FIG. 2E, after forming the conductive substrate 208, the carrier substrate 202 is removed from the multi-layer epitaxial structure 204. The carrier substrate 202 can be removed by a laser lift-off process, a wet etching process, a grinding process or a chemical mechanical polishing process. Then, a contact 210 is formed on the multi-layer epitaxial structure 204 opposite to the contact 206 to complete a light-emitting diode (LED) chip 300. The contact 210 can be formed from indium tin oxide (ITO), Ag, Al, Cr, Ni, Au, Pt, Pd, Ti, Ta, TiN, TaN, Mo, W or other conductive materials. The contact 210 may be a p-type contact or an n-type contact, which has an opposite conductivity to the contact 206.

Figure 2F:
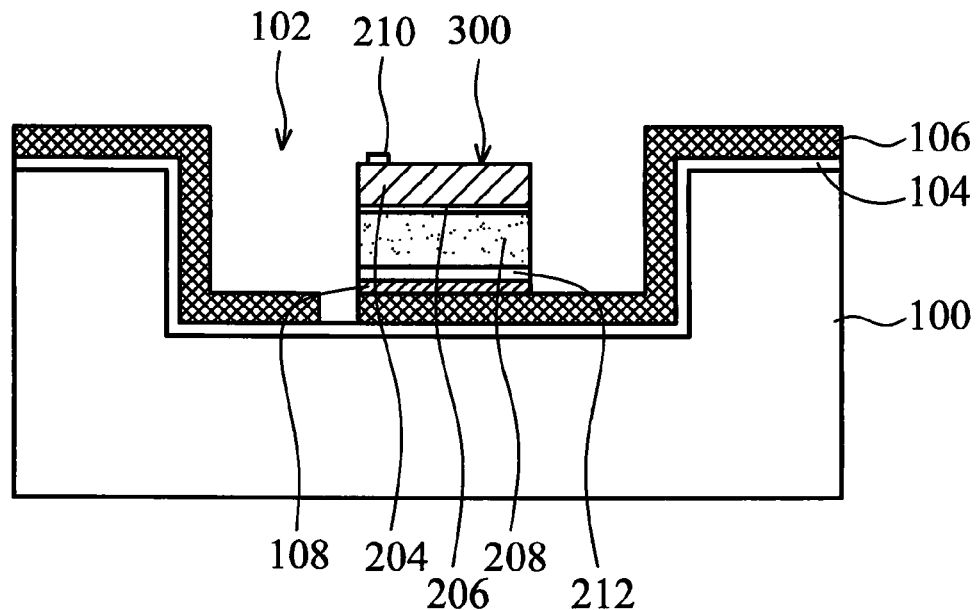

Next, referring to FIG. 2F, the LED chip 300 is disposed in the cavity 102 of the substrate 100 and soldered on the patterned first metal layer 108 through a solder layer 212. In an embodiment, the solder layer 212 may be formed from Sn—Cu alloy including 99 to 99.3 wt % of Sn and 0.7 to 1 wt % of Cu. The solder layer 212 can be formed on the conductive substrate 208 or on the patterned first metal layer 108 by a sputtering method, an e-gun evaporation method or a stencil printing method. Then, the LED chip 300 is soldered on the substrate 100 through the solder layer 212 by a reflow process.

Note that in embodiments of the invention, the bonding strength between the LED chip 300 and the substrate 100 is higher than the conventional LED packages using the silver glue. Specifically, a higher bonding strength is achieved by soldering the Cu substrate 208 and the Sn—Cu alloy solder layer 212 together. Moreover, the patterned first metal layer 108 of Ag or Au is coated on the patterned multi-layered metal structure 106 to be soldered to the solder layer 212 of Sn—Cu alloy. Thus, bonding strength is further enhanced.

Figure 2G:
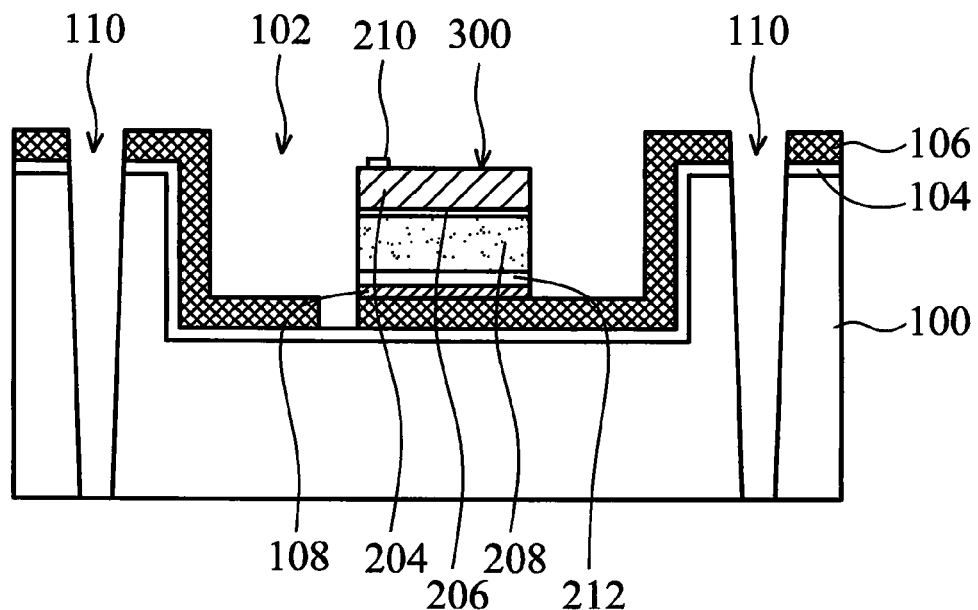
Figure 2H:
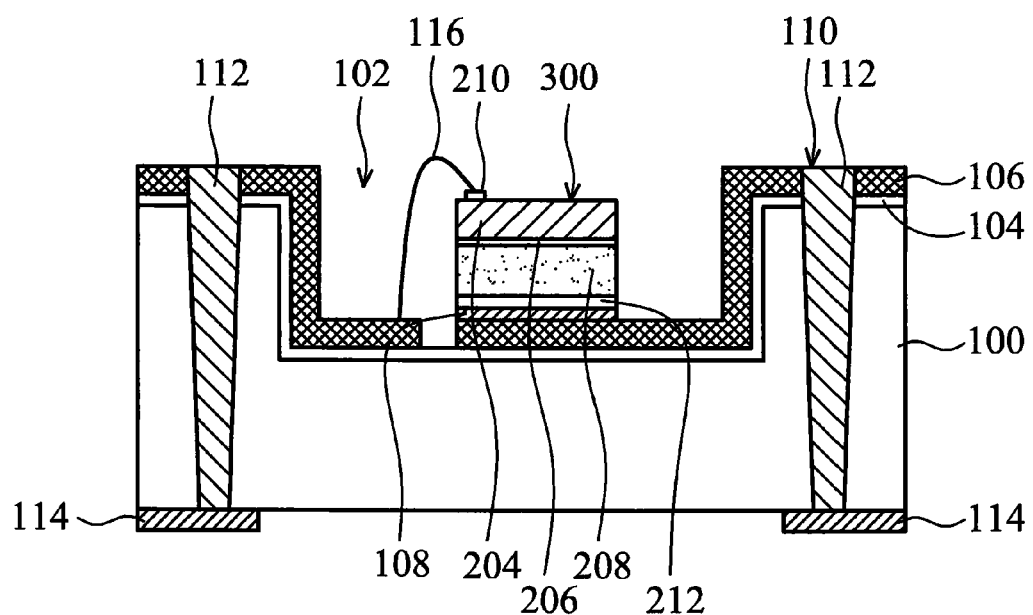

Next, referring to FIG. 2G, a plurality of through holes 110 is formed passing through the patterned multi-layered metal structure 106, the insulating layer 104 and the substrate 100. Referring to FIG. 2H, then, the through holes 110 are filled with a conductive material to form a plurality of through vias 112. In addition, a conductive pad 114 is formed on the bottom surface of the substrate 100 and directly contacts with the through via 112. The conductive pads 114 can be used for electrically connecting to an external circuit (not shown). Next, a conductive wire 116 is formed to electrically connect the upper contact 210 of the LED chip 300 to the patterned multi-layered metal structure 106. Thus, the upper contact 210 and the lower contact 206 of the LED chip 300 are electrically connected to the through vias 112 respectively through the patterned multi-layered metal structure 106 and further electrically connected to the external circuit through the conductive pads 114. A cross section of an LED package according to an embodiment of the invention is shown as FIG. 2H.

Figure 3:
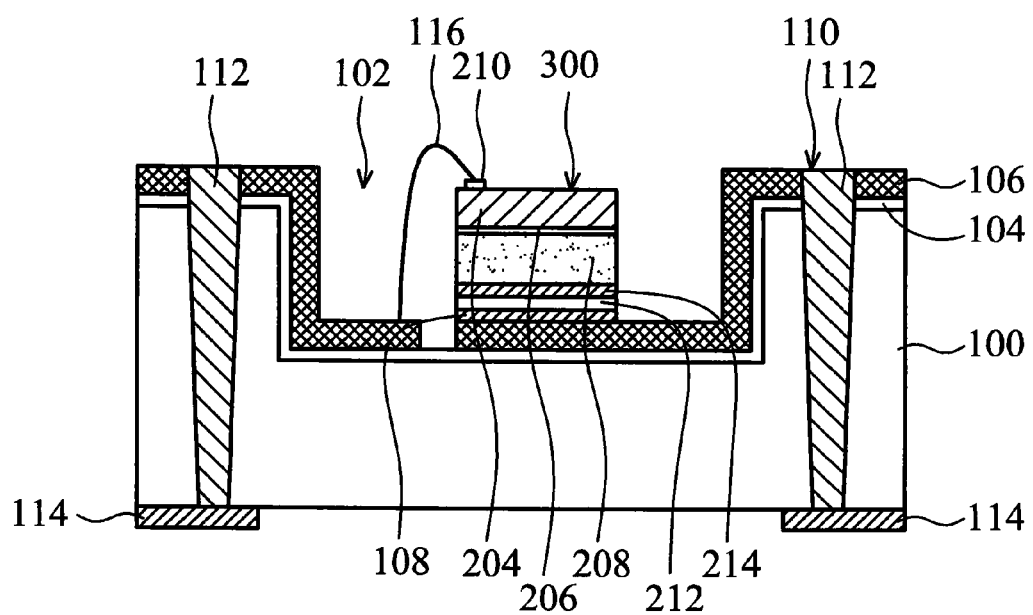
FIG. 3 is a cross section of an LED package according to another embodiment of the invention.

Next, referring to FIG. 3, a cross section of an LED package according to another embodiment of the invention is shown. The difference between the LED packages of FIG. 3 and FIG. 2H is that the LED package of FIG. 3 has an additional metal layer 214 formed between the conductive substrate 208 of the LED chip 300 and the solder layer 212. In an embodiment, the metal layer 214 may comprise Cu, Ni, Au or Ag, wherein Au or Ag is preferred. The additional metal layer 214 can increase the ohmic contact of the LED chip 300. Moreover, a higher bonding strength can be obtained in the interface between the additional metal layer 214 and the Sn—Cu alloy solder layer 212.

According to the aforementioned embodiments, the LED packages of the invention have several advantages. First, the solder layer made of Sn—Cu alloy is used to be soldered to the conductive substrate made of Cu of the LED chip. Thus, the bonding strength in the interface between the conductive substrate of the LED chip and the solder layer is enhanced. Moreover, the metal layer made of Ag or Au is coated on the multi-layered metal structure overlying the substrate, such that the bonding strength in the interface between the metal layer over the substrate and the solder layer is further enhanced. Accordingly, the reliability of the LED packages of the invention is better than that of the conventional LED packages using silver glue.

Second, the cost of the solder layer made of Sn—Cu alloy is less than that of the solder layer made of Sn—Au alloy. Thus, the fabrication cost of the LED packages of the invention is less than that of the conventional LED packages using Sn—Au eutectic bond.

Third, using the solder layer made of Sn—Cu alloy to be soldered to the conductive substrate made of Cu of the LED chip and the metal layer of Ag or Au over the substrate, improves heat dissipation efficiency of the LED package, such that the light-emitting efficiency of the LED device of the invention is enhanced.

In addition, according to the embodiments of the invention, the LED chip is disposed in the cavity of the substrate, such that the LED chip is prevented from being peeling off of the substrate, thereby enhancing reliability of the LED package. Moreover, the LED packages of the invention can be applied to substrates having through vias therein, such that the size of the LED package may be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode package, comprising:
a substrate;
a cavity disposed in the substrate, wherein the cavity has a depth of 30 µm to 150 µm;
a first metal layer disposed over the substrate and in the cavity;
an insulating layer disposed between the first metal layer and the substrate;
a multi-layered metal structure disposed between the first metal layer and the insulating layer;
a solder layer disposed on the first metal layer;
a light-emitting diode chip disposed on the solder layer, wherein the light-emitting diode chip comprises a conductive substrate, a contact disposed on the conductive substrate and a multilayered epitaxial structure disposed on the contact, and wherein the conductive substrate is adjacent to the solder layer; and
a second metal layer disposed between the conductive substrate of the light-emitting diode chip and the solder layer.

2. The light-emitting diode package as claimed in claim 1, wherein the solder layer comprises an Sn—Cu alloy.

3. The light-emitting diode package as claimed in claim 2, wherein the Sn—Cu alloy comprises 99 to 99.3 wt % of Sn and 0.7 to 1 wt % of Cu.

4. The light-emitting diode package as claimed in claim 1, wherein the conductive substrate of the light-emitting diode chip comprises Cu.

5. The light-emitting diode package as claimed in claim 1, wherein the first metal layer comprises Ag, Au, Cu or Ni.

6. The light-emitting diode package as claimed in claim 1, wherein the substrate comprises a semiconductor substrate, a ceramic substrate or a printed circuit board.

7. The light-emitting diode package as claimed in claim 1, wherein the light-emitting diode chip and the solder layer are disposed in the cavity.

8. The light-emitting diode package as claimed in claim 1, wherein the first metal layer has a length and a width the same as a length and a width of the light-emitting diode chip from a top view.

9. The light-emitting diode package as claimed in claim 1, wherein the second metal layer comprises Ag, Au, Cu or Ni.

10. The light-emitting diode package as claimed in claim 1, wherein the multi-layered metal structure comprises TiW, Cu and Ni layers.

11. The light-emitting diode package as claimed in claim 1, further comprising a conductive wire disposed on the light-emitting diode chip for electrically connecting the light-emitting diode chip to the multi-layered metal structure.

12. The light-emitting diode package as claimed in claim 1, wherein the light-emitting diode chip comprises a vertical light-emitting diode chip having a p-type contact and an n-type contact disposed opposite to the p-type contact.

13. The light-emitting diode package as claimed in claim 12, further comprising a plurality of through vias disposed in the substrate, wherein the p-type contact and the n-type contact are electrically connected to the through vias, respectively.

14. The light-emitting diode package as claimed in claim 1, wherein the light-emitting diode chip comprises a horizontal light-emitting diode chip having a p-type contact and an n-type contact disposed on a same side.

15. The light-emitting diode package as claimed in claim 14, further comprising a plurality of through vias disposed in the substrate, wherein the p-type contact and the n-type contact are electrically connected to the through vias, respectively.

16. The light-emitting diode package as claimed in claim 1, wherein the light-emitting diode chip is soldered on the substrate through the solder layer by a reflow process.

17. The light-emitting diode package as claimed in claim 1, wherein the conductive substrate of the light-emitting diode chip comprises Cu, the conductive substrate has a length and a width the same as a length and a width of the light-emitting diode chip from a top view, and the conductive substrate is disposed between the contact of the light-emitting diode chip and the solder layer.

* * * * *